United States Patent
Lee

(10) Patent No.: US 10,992,309 B1
(45) Date of Patent: Apr. 27, 2021

(54) ANALOG-TO-DIGITAL CONVERTER INCLUDING DELAY CIRCUIT AND COMPENSATOR, IMAGE SENSOR INCLUDING THE ANALOG-TO-DIGITAL CONVERTER, AND METHOD OF OPERATING THE SAME

(71) Applicant: SAMSUNG ELECTRONICS CO., LTD., Suwon-si (KR)

(72) Inventor: Hyeokjong Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/936,851

(22) Filed: Jul. 23, 2020

(30) Foreign Application Priority Data

Oct. 21, 2019 (KR) .................. 10-2019-0130811

(51) Int. Cl.
*H03M 1/06* (2006.01)
*H03M 1/56* (2006.01)
(Continued)

(52) U.S. Cl.
CPC ............ *H03M 1/56* (2013.01); *H03M 1/08* (2013.01); *H03M 1/1205* (2013.01); *H03M 1/14* (2013.01);
(Continued)

(58) Field of Classification Search
CPC .......... H03M 1/14; H03M 1/56; H03M 1/123; H03M 1/12; H03M 1/48; H03M 1/64;
(Continued)

(56) References Cited

U.S. PATENT DOCUMENTS 9,019,142 B2   4/2015  Hiraoka et al.
9,529,336 B2  12/2016  Liu et al.
(Continued)

FOREIGN PATENT DOCUMENTS

JP        3141832       3/2001
KR   10-2001-0055300    7/2001

OTHER PUBLICATIONS

Lu et al., "A 3.6 mW, 90 nm CMOS Gated-Vernier Time-to-Digital Converter With an Equivalent Resolution of 3.2 ps", IEEE Journal of Solid-State Circuits, Jul. 2012.

*Primary Examiner* — Linh V Nguyen
(74) *Attorney, Agent, or Firm* — F. Chau & Associates, LLC

(57) ABSTRACT

An analog-to-digital converter for converting a pixel signal generated from sensed light into a digital signal includes a comparator configured to compare the pixel signal with a ramp signal having a constant slope to generate a comparison signal; a delay circuit configured to generate a first signal corresponding to the comparison signal, the delay circuit including a plurality of delay elements configured to generate a second signal by delaying the first signal by a first time period; and a compensator circuit configured to measure a period of the comparison signal to output a delay select signal to the delay circuit based on the measured period, the delay select signal delaying the first signal by the first time period, wherein the first time period is obtained by dividing the period of the comparison signal.

20 Claims, 15 Drawing Sheets

(51) Int. Cl.
*H03M 1/12* (2006.01)
*H03M 1/14* (2006.01)
*H04N 5/357* (2011.01)
*H04N 5/3745* (2011.01)
*H04N 5/376* (2011.01)
*H03M 1/08* (2006.01)

(52) U.S. Cl.
CPC ......... *H04N 5/3575* (2013.01); *H04N 5/3765* (2013.01); *H04N 5/37455* (2013.01)

(58) Field of Classification Search
CPC ........ H03M 3/00; H03M 3/458; H03M 1/502; H03M 1/60; H03M 1/002; H03M 1/06; H03M 1/0624; H03M 1/1014; H03M 1/122; H03M 1/124; H03M 1/167; H03M 1/36; H03M 1/46; H03M 1/52; H03M 1/665; H03M 3/424; H03M 3/43; H04N 5/378; H04N 5/3742; H04N 5/3765; H04N 5/357; H04N 5/3658; H04N 5/335; H04N 5/374; H04N 5/3745

USPC .................. 341/118, 120, 142, 155, 169
See application file for complete search history.

(56) References Cited

U.S. PATENT DOCUMENTS

| | | | |
|---|---|---|---|
| 9,571,113 B2 | 2/2017 | Ikebe | |
| 2003/0235260 A1* | 12/2003 | Nakamura | H03L 7/0812 375/374 |
| 2009/0109315 A1* | 4/2009 | Taura | H03M 1/56 348/311 |
| 2010/0271525 A1* | 10/2010 | Takahashi | H04N 5/3742 348/308 |
| 2011/0037871 A1* | 2/2011 | Suzuki | H04N 5/378 348/222.1 |
| 2011/0292265 A1* | 12/2011 | Takahashi | H03M 1/502 348/308 |
| 2016/0246262 A1* | 8/2016 | Liu | H03M 1/34 |
| 2017/0070695 A1* | 3/2017 | Shinozuka | H04N 5/378 |
| 2018/0139401 A1* | 5/2018 | Liabeuf | H04N 5/374 |
| 2019/0052827 A1 | 2/2019 | Koyama | |
| 2019/0098234 A1 | 3/2019 | Lee | |

* cited by examiner

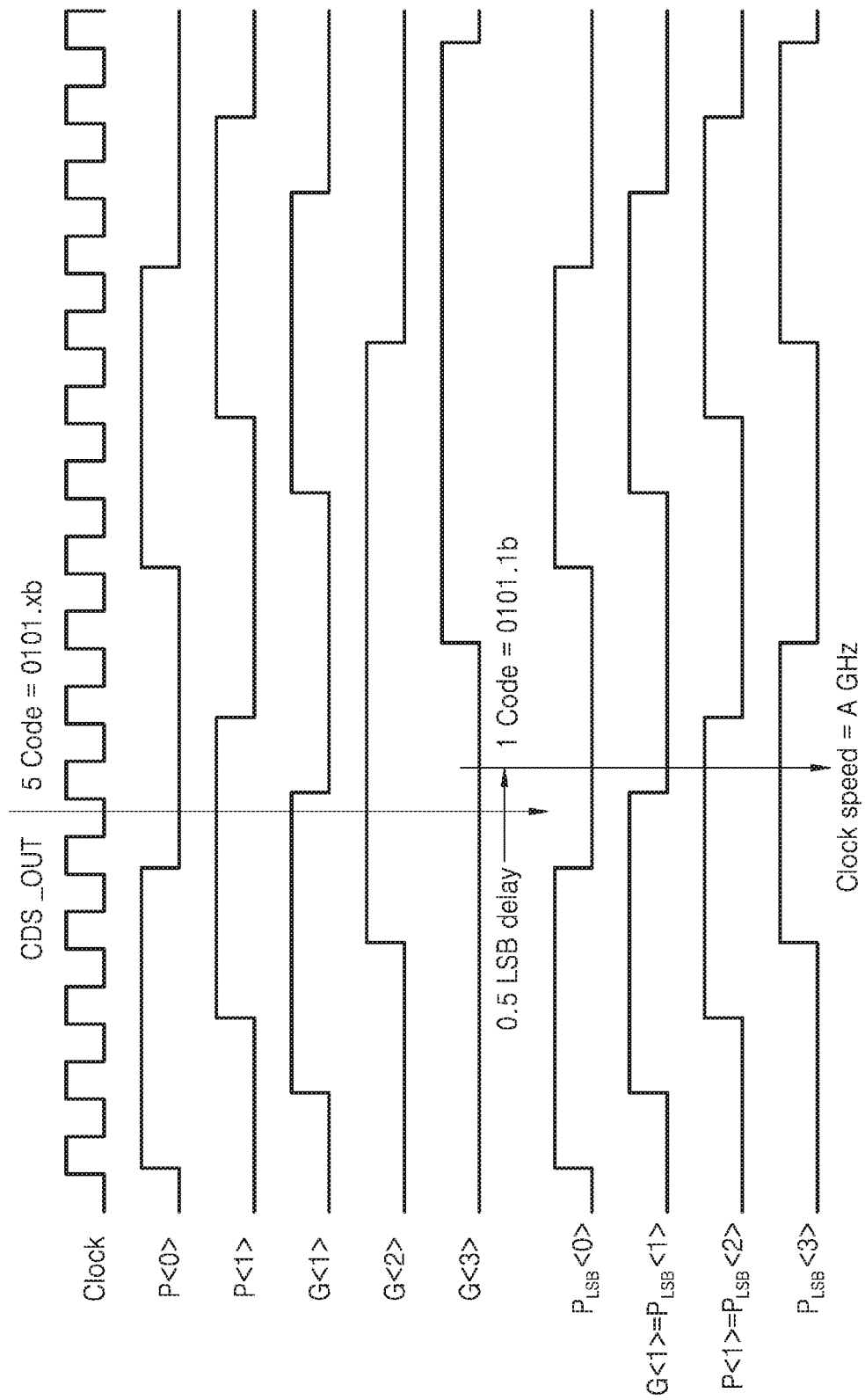

ANALOG-TO-DIGITAL CONVERTER INCLUDING DELAY CIRCUIT AND COMPENSATOR, IMAGE SENSOR INCLUDING THE ANALOG-TO-DIGITAL CONVERTER, AND METHOD OF OPERATING THE SAME

CROSS-REFERENCE TO RELATED APPLICATION

This U.S. non-provisional patent application claims the benefit of priority under 35 U.S.C. § 119 to Korean Patent Application No. 10-2019-0130811, filed on Oct. 21, 2019, in the Korean Intellectual Property Office, the disclosure of which is incorporated by reference in its entirety herein.

BACKGROUND

1. Technical Field

The inventive concept relates to an analog-to-digital converter (ADC), and more particularly, to an ADC including a digital correlated double sampling (CDS) circuit and an image sensor including the ADC.

2. Discussion of Related Art

An image sensor is a device that detects and conveys information used to make an image. The two main types of image sensors include a charge-coupled device (CCD) image sensor and a complementary metal oxide semiconductor (CMOS) image sensor. Cameras integrated in small consumer products (e.g., smart phones) typically include CMOS image sensors for capturing images. The CMOS image sensors may be arranged into an array of pixels (e.g., a pixel array).

An analog pixel signal output from the pixel array may include a variation due to a difference between intrinsic characteristics of the pixels, such as a fixed pattern noise (FPN). Further, a digital pixel signal generated from the analog pixel signal may have a variation due to a difference between characteristics of analog-to-digital conversion elements respectively arranged at columns of the pixel array. A CDS circuit including a counter may be used to compensate for such variations. However, use of the CDS circuit to perform this compensation may require the counter to operate at a very high speed, which increases power consumption.

SUMMARY

At least one embodiment of the inventive concept provides an analog-to-digital converter (ADC) for increasing an operating speed of an image sensor without increasing a clock speed of the image sensor and an image sensor including the same.

According to an exemplary embodiment of the inventive concept, there is provided an ADC for converting a pixel signal (e.g., an analog signal) generated from sensed light into a digital signal. The ADC includes a comparator configured to compare the pixel signal with a ramp signal having a constant slope to generate a comparison signal; a delay circuit configured to generate a first signal corresponding to the comparison signal, the delay circuit including a plurality of delay elements configured to generate a second signal by delaying the first signal by a first time period; and a compensator circuit configured to measure a period of the comparison signal and to output a delay select signal to the delay circuit based on the measured period, the delay select signal delaying the first signal by the first time period, wherein the first time period is obtained by dividing the period of the comparison signal.

According to an exemplary embodiment of the inventive concept, there is provided an image sensor including a pixel array including a plurality of pixels arranged in a matrix, each of the plurality of pixels configured to generate a pixel signal; a ramp generator configured to generate a ramp signal in response to a ramp enable signal, the ramp signal having a constant slope; a comparator configured to compare the pixel signal with the ramp signal to generate a comparison signal; a plurality of delay circuits each including a plurality of delay elements configured to delay the comparison signal, each of the plurality of delay circuits configured to generate a first signal corresponding to the comparison signal and to generate a second signal by delaying the first signal by a first time period; a compensator circuit configured to measure a period of the comparison signal and to output a delay select signal to the plurality of delay circuits based on the measured period, the delay select signal delaying the first signal by the first time period; a phase generator configured to generate a plurality of phase-shift codes based on a clock signal; a timing generator configured to generate the clock signal and the ramp enable signal; a latch circuit configured to latch the plurality of phase-shift codes based on the first signal and the second signal; and a column counter configured to generate a binary code based on a digital code output from the latch circuit and to sequentially output the binary code bit by bit, wherein the first time period is obtained by dividing the period of the comparison signal.

According to an exemplary embodiment of the inventive concept, there is provided a method of operating an ADC. The method includes comparing a pixel signal with a ramp signal to generate a comparison signal; inverting the comparison signal to generate a first signal; measuring a period of the first signal; determining a first time period based on the measured period; generating a delay select signal for delaying the first signal by the first time period; and outputting a second signal by delaying the first signal by the first time period based on the delay select signal.

BRIEF DESCRIPTION OF THE DRAWINGS

Embodiments of the inventive concept will be more clearly understood from the following detailed description taken in conjunction with the accompanying drawings in which:

FIG. 6 is a timing diagram illustrating a clock signal and signals generated from the clock signal, according to an exemplary embodiment of the inventive concept;

DETAILED DESCRIPTION OF THE EXEMPLARY EMBODIMENTS

Hereinafter, embodiments will be described in detail with reference to the accompanying drawings.

Figure 1:
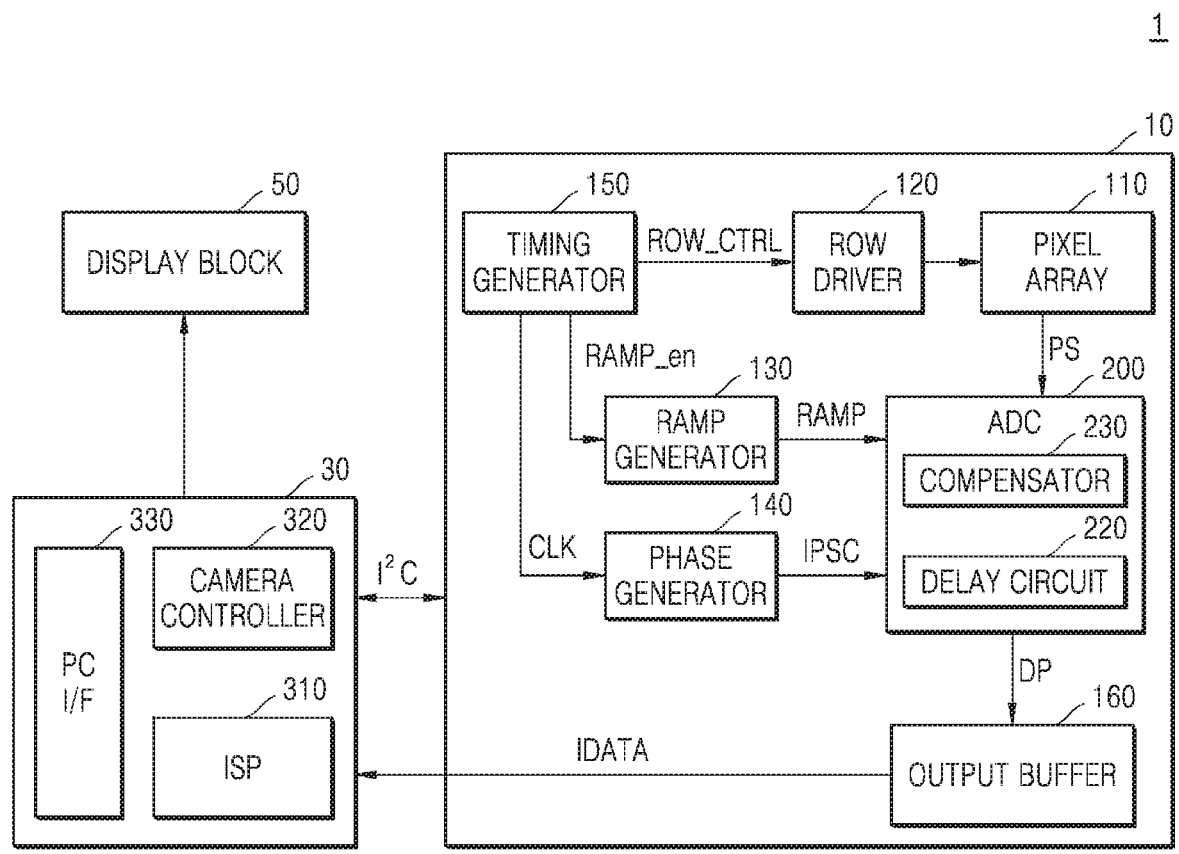
FIG. 1 is a block diagram of an image processing system including an image sensor including an analog-to-digital converter (ADC), according to an exemplary embodiment of the inventive concept.

FIG. 1 is a block diagram of an image processing system 1 including an image sensor 10 including an analog-to-digital converter (ADC) 200, according to an exemplary embodiment of the inventive concept. Referring to FIG. 1, the image processing system 1 includes the image sensor 10, an image processor 30, and a display block 50 (e.g., a display device).

The image sensor 10 includes a pixel array 110, a row driver 120 (e.g., driving circuit), a ramp generator 130 (e.g., a voltage generator), a phase generator 140 (e.g., a signal generator), a timing generator 150 (e.g., a signal generator), the ADC 200, and an output buffer 160. The image sensor 10 may also include additional components for increasing an image sensing ability.

The image sensor 10 may be mounted on electronic devices having a function of sensing an image or light. For example, the image sensor 10 may be mounted on electronic devices such as a camera, a smartphone, a wearable device, an Internet of things (IoT) device, a tablet personal computer (PC), a personal digital assistant (PDA), a portable multimedia player (PMP), a navigation device, a drone, and an advanced drivers assistance system (ADAS). The image sensor 10 may also be mounted on electronic devices that are used as components of vehicles, furniture, manufacturing facilities, doors, or various kinds of measuring equipment. The image sensor 10 may be controlled by the image processor 30 to sense an object captured through a lens (not shown).

The pixel array 110 includes a plurality of row lines, a plurality of column lines, and a plurality of pixels arranged in a matrix form, wherein each of the pixels is connected to a row line and a column line. A row line may include a plurality of lines to transmit a row selection signal and a pixel control signal to a pixel connected thereto.

In an exemplary embodiment, each of the pixels includes a photosensitive device, senses light using the photosensitive device and converts the sensed light into a pixel signal PS (e.g., an analog electrical signal). For example, the photosensitive device may include a photodiode, a photo transistor, a photo gate, a pinned photo diode (PPD), or a combination thereof. In an exemplary embodiment, the photosensitive device has a four-transistor structure including a photodiode, a transfer transistor, a reset transistor, an amplifier transistor, and a select transistor. According to an embodiment, a photosensitive device may have a one-transistor structure, a three-transistor structure, or a five-transistor structure or may have a structure in which some transistors are shared between a plurality of pixels.

The row driver 120 drives the pixel array 110 row by row. The row driver 120 may decode a row control signal ROW_CTRL (e.g., an address signal) received from the timing generator 150 and select at least one of the rows of the pixel array 110 in response to the decoded row control signal. For example, the row driver 120 may generate a row select signal. A row select signal and a pixel control signal for controlling a selected pixel may be provided to a pixel through a row line.

Pixel signals PS are output from pixels of a row that is selected by a row select signal provided from the row driver 120. The pixel signals PS may include a reset signal and an image signal. A voltage difference between the reset signal and the image signal may include information about the amount of light received by each pixel. For example, when a pixel receives no light, the reset signal is the same as the image signal. When a pixel receives light, a voltage of the reset signal may be different from a voltage of the image signal.

The ramp generator 130 may generate a ramp signal RAMP. The ramp generator 130 may operate based on a ramp control signal from the timing generator 150. The ramp control signal may include a ramp enable signal RAMP_en. When the ramp enable signal RAMP_en is activated, the ramp generator 130 may generate the ramp signal RAMP having a constant slope. The ramp signal RAMP may increase or decrease with a constant slope.

The phase generator 140 generates input phase-shift code IPSC based on a clock signal CLK. The input phase-shift code IPSC may include a plurality of phase-shift signals, which have the same period and respectively have phases that partially overlap. For example, the input phase-shift code IPSC may include first through $2^n$ phase-shift signals, where "n" is a natural number of at least 2.

The ADC 200 receives analog signals (e.g., pixel signals PS), output from pixels of a selected row and converts the pixel signals PS into digital signals. A digital signal may be referred to as a digital pixel value DP. The digital pixel value DP generated by the ADC 200 is output to the output buffer 160.

In an exemplary embodiment, the ADC 200 uses a correlated double sampling (CDS) technique to convert a voltage level of a pixel into digital code. The CDS technique may be used to remove fixed pattern noise (FPN), which is may be observed in a signal output from a pixel of an image sensor, and to detect a desired signal component. Use of the CDS technique may greatly reduce intrinsic FPN of a pixel and noise caused by a characteristic difference between pixels. The CDS technique uses a difference between a reset signal, which maintains a constant voltage level, and an image signal corresponding to an optical signal sensed by each pixel.

The ADC 200 includes a delay circuit 220 and a compensator 230 (e.g., a circuit). The delay circuit 220 and the compensator 230 will be described with reference to FIGS. 2 through 4C.

The timing generator 150 may provide a control signal and/or a clock signal CLK to each of the components (e.g., the row driver 120, the ramp generator 130, the phase generator 140, and the ADC 200) of the image sensor 10. Each of the row driver 120, the ramp generator 130, and the ADC 200 may operate according to the timing set therefor based on the control signal and/or the clock signal CLK provided from the timing generator 150. For example, a counter included in the ADC 200 may receive a counting signal and the clock signal CLK from the timing generator 150. For example, the timing generator 150 may generate and output a row control signal ROW_CTRL to the row driver 120, may generate and output the ramp enable signal RAMP_en to the ramp generator 130, and may generate and output the clock signal CLK to the phase generator 140.

The output buffer 160 may temporarily store a plurality of digital pixel values DP output from the ADC 200 and then amplify and output the digital pixel values DP. The output buffer 160 may include a plurality of memories (not shown) and a sense amplifier (not shown). Each of the memories may temporarily store the digital pixel values DP output from the ADC 200 and then sequentially or selectively output the digital pixel values DP to the sense amplifier. The sense amplifier may sense and amplify the digital pixel values DP. The sense amplifier may output amplified digital pixel values as image data IDATA.

The image processor 30 may process the image data IDATA that has been sensed and output by the image sensor 10 and may output processed image data to the display block 50. The image processor 30 includes an image signal processor (ISP) 310, a camera controller 320 (e.g., a control circuit), and a PC interface (I/F) 330 (e.g., an interface circuit). For example, the camera controller 320 may control the image sensor 10 using an inter-integrated circuit ($I^2C$). However, embodiments of the inventive concept are not limited thereto, and various interfaces may be used between the camera controller 320 and the image sensor 10.

The ISP 310 may receive the image data IDATA (e.g., an output signal of the output buffer 160), process the image data IDATA to generate an image capable of being viewed by a human being, and output the processed image to the display block 50. Alternatively, the ISP 310 may receive a control signal from an external host through the PC I/F 330 and provide a processed image to the external host. Although the ISP 310 is located in the image processor 30 in FIG. 1, embodiments of the inventive concept are not limited thereto. For example, the ISP 310 may be located in the image sensor 10.

The display block 50 includes any device that may output an image. For example, the display block 50 may include a computer, a cellular phone, or another image output terminal.

The image sensor 10 includes a delay circuit 220 to generate a digital pixel value DP, and the delay circuit 220 may generate at least one signal delayed based on a delay select signal received from the compensator 230. An additional bit may be secured by generating pixel data in a digital domain using at least one signal. This will be described below with reference to FIGS. 2 through 10.

Figure 2:
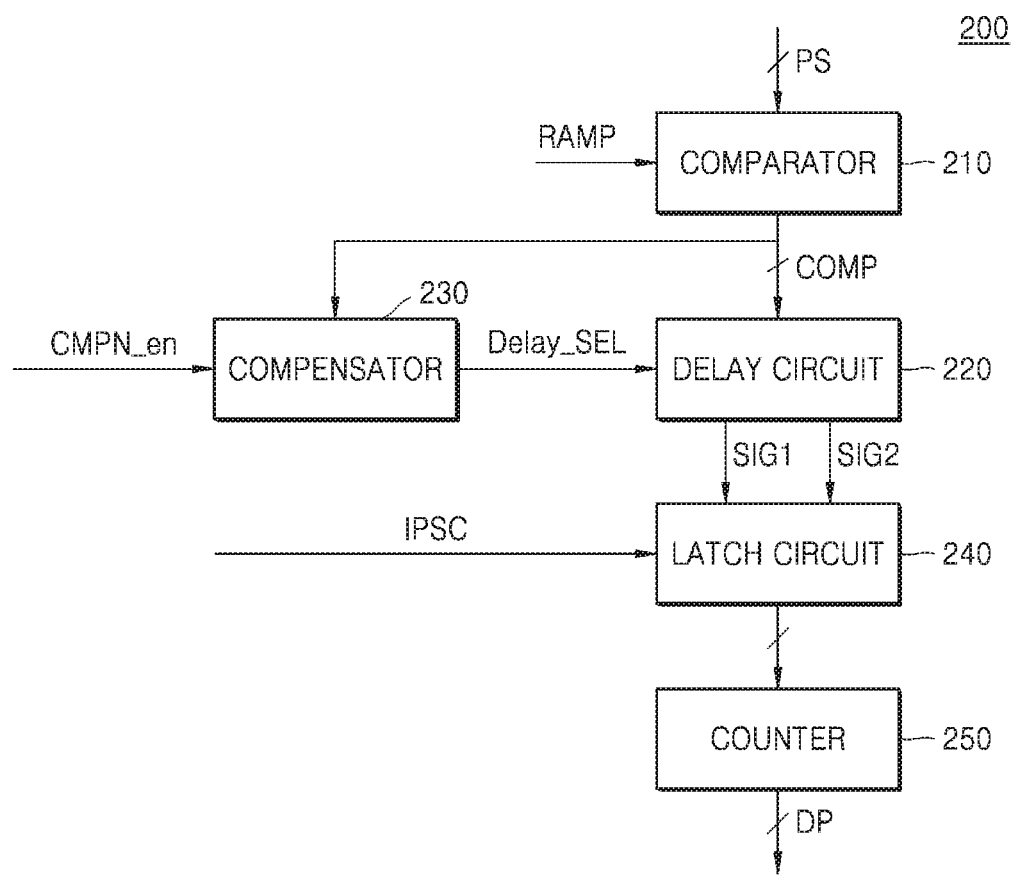
FIG. 2 is a block diagram of an ADC according to an exemplary embodiment of the inventive concept.

FIG. 2 is a block diagram of the ADC 200 according to an exemplary embodiment of the inventive concept. Referring to FIG. 2, the ADC 200 includes a comparator 210 (e.g., a comparison circuit, an operational amplifier, etc.), the delay circuit 220, the compensator 230, a latch circuit 240, and a counter 250 (e.g., a counter circuit).

The comparator 210 may receive a plurality of pixel signals PS from each column of the pixel array 110 through a column line. The comparator 210 may compare the ramp signal RAMP from the ramp generator 130 with each pixel signal PS to generate a comparison result and output the comparison result as logic low or logic high. The comparator 210 may generate the comparison result using CDS as a comparison signal COMP.

A plurality of pixel signals PS that are respectively output from a plurality of pixels may have a variation due to intrinsic characteristics (e.g., FPN) of pixels and/or a variation due to a difference between characteristics of logic elements (e.g., transistors outputting a photocharge stored in photoelectric conversion elements of pixels) each outputting a pixel signal PS from a pixel. To compensate for a variation in a plurality of pixel signals PS output through a plurality of column lines, a process of obtaining a reset signal (or a reset component) and a cell signal (or a unit component) for each pixel signal PS and extracting a difference (e.g., a voltage difference) between the reset signal and the cell signal as a valid signal component is performed. This process may be referred to as CDS. The comparator 210 may output the comparison signal COMP corresponding to the comparison result using CDS.

The delay circuit 220 may output a first signal SIG1 having a phase that is identical or opposite to a phase of the comparison signal COMP applied from the comparator 210. The delay circuit 220 may also output a second signal SIG2 by delaying the comparison signal COMP by a certain time period. According to an exemplary embodiment, the delay circuit 220 includes a plurality of delay elements. Each of the delay elements may delay an input signal by a certain time period (e.g., a first time period) and output a signal to a subsequent delay element, and accordingly, the delay circuit 220 may output a signal that has a phase lagging the phase of the input signal by a time period corresponding to the number of delay elements. In other words, the delay circuit 220 may output the comparison signal COMP or a signal having an opposite phase to the comparison signal COMP as the first signal SIG1 and simultaneously output the second signal SIG2 by delaying the comparison signal COMP by a certain time period.

The delay circuit 220 may select and output a first delay signal among delay signals, which are respectively output from a plurality of delay elements, in response to a delay select signal Delay_SEL output from the compensator 230. In other words, the delay select signal Delay_SEL may select a delay element, which outputs a delay signal that lags an input signal by the first time period, among a plurality of delay elements of the delay circuit 220 and may output the first delay signal output by the selected delay element as the second signal SIG2.

According to an exemplary embodiment, the first time period corresponds to 0.5 least significant bit (LSB). Here, LSB may refer to bit information at the lowest position among binary bits. In other words, the first time period may refer to a period of a pulse signal corresponding to the lowest bit. According to an exemplary embodiment, the first time period corresponds to 0.25 LSB. In the current specification, 0.5 LSB or 0.25 LSB is suggested as the first time period, but embodiments of the inventive concept are not limited thereto. Besides 0.5 LSB and 0.25 LSB, the first time period may correspond to any one of various time periods that are obtained by dividing an LSB period into certain ratios. The configuration that outputs the first delay signal in response to the delay select signal Delay_SEL will be described in detail with reference to FIGS. 3A through 4C.

The compensator 230 may output the delay select signal Delay_SEL to the delay circuit 220 to reduce power-voltage-temperature (PVT) noise of the delay circuit 220. The compensator 230 may include a plurality of compensation delay elements. The compensator 230 may also include a ripple counter that measures the period of an input signal. The ripple counter may count ripples corresponding to the measured period of an input signal. The compensator 230 may measure the period of an input signal (i.e., the comparison signal COMP), and may generate the delay select signal Delay_SEL, which indicates an index of a compensation delay element, based on the measured period of the comparison signal COMP. In other words, the ripple counter may count ripples corresponding to the measured period of a signal to generate a count result and generate the delay select signal Delay_SEL based on the count result. According to an exemplary embodiment, the delay select signal Delay_SEL may correspond to an index of a compensation delay element, which outputs a first delay select signal lagging by the first time period, among a plurality of compensation delay elements.

The compensator 230 may measure the period of the comparison signal COMP and identify a compensation delay element, which outputs a delay select signal for delaying a signal by the first time period (e.g., a time period corresponding to 0.5 LSB), among a plurality of compensation delay elements based on the measured period of the comparison signal COMP. In an exemplary embodiment, the first time period is obtained by dividing the period of the comparison signal. The compensator 230 may generate the first delay select signal representing an index indicating the compensation delay element and output the first delay select signal to the delay circuit 220. Accordingly, the delay circuit 220 may generate a signal, which lags by a time period closely approximating to the first time period despite a variation in PVT noise, adaptively to the variation in PVT noise.

The compensator 230 may have a similar path to the delay circuit 220. According to an exemplary embodiment, the compensator 230 includes the same number of delay elements as the delay circuit 220. For example, the compensator 230 may include the same numbers of inverters, NAND gates, and multiplexers as the delay circuit 220. In other words, the compensator 230 may be configured to have a similar PVT noise tendency to the delay circuit 220. However, embodiments of the inventive concept are not limited to the configuration in which the compensator 230 includes the same number of elements as the delay circuit 220. The compensator 230 and the delay circuit 220 may include various numbers of elements that show similar PVT noise distributions. For convenience of description, it is assumed that the delay circuit 220 and the compensator 230 include the same number of elements.

In an exemplary embodiment, the compensator 230 is implemented as a time-to-digital converter (TDC). TDC may be classified into various types such as a Vernier type or a ring oscillator type.

The compensator 230 may be turned on or off in response to a compensation enable signal CMPN_en. According to an exemplary embodiment, the ADC 200 generates a delayed signal in correspondence to PVT variations by turning on or off the compensator 230 when necessary or generates a delayed signal regardless of PVT variations. A configuration in which the compensator 230 generates the delay select signal Delay_SEL will be described in detail with reference to FIGS. 4A through 4C.

The latch circuit 240 may latch the input phase-shift code IPSC and sequentially store a phase-shift code representing a reset component and phase-shift code representing an image component. In an exemplary embodiment, the reset component and the image component (or a signal component) are included in an analog pixel signal PS output from the pixel array 110 of the image sensor 10.

According to an exemplary embodiment, the input phase-shift code IPSC includes a plurality of phase-shift signals, which have the same period and respectively have phases that partially overlap. For example, the input phase-shift code IPSC may include first through $2^n$ phase-shift signals, where "n" is a natural number of at least 2.

The latch circuit 240 may latch the input phase-shift code IPSC based on the first signal SIG1, which corresponds to the comparison signal COMP output from the comparator 210, and the second signal SIG2, which is obtained by delaying the comparison signal COMP. After being latched, the input phase-shift code IPSC may be output to the counter 250.

The counter 250 may count the input phase-shift code IPSC output from the latch circuit 240. The counter 250 may receive the clock signal CLK (in FIG. 1) from the timing generator 300 (in FIG. 1). The counter 250 may count the input phase-shift code IPSC output from the latch circuit 240 based on the clock signal CLK in a period in which a counting signal is activated (e.g., in a logic high period of the clock signal CLK). The counter 250 may count a logic high or logic low comparison result of the input phase-shift code IPSC to generate a count result, which is output from the latch circuit 240, based on the clock signal CLK in a reset conversion period, in which a reset signal is sensed, and in a signal conversion period, in which the pixel signal PS is sensed, and may output the digital pixel value DP according to the count result.

The counter 250 may generate a gray code based on the input phase-shift code IPSC output from the latch circuit 240 and generate a binary code based on the gray code. The binary code may be referred to as the digital pixel value DP. The binary code or the digital pixel value DP may be sequentially output to the output buffer 160. The gray code and the binary code, which are generated by the counter 250, will be described in detail with reference to FIG. 5.

Figure 3A:
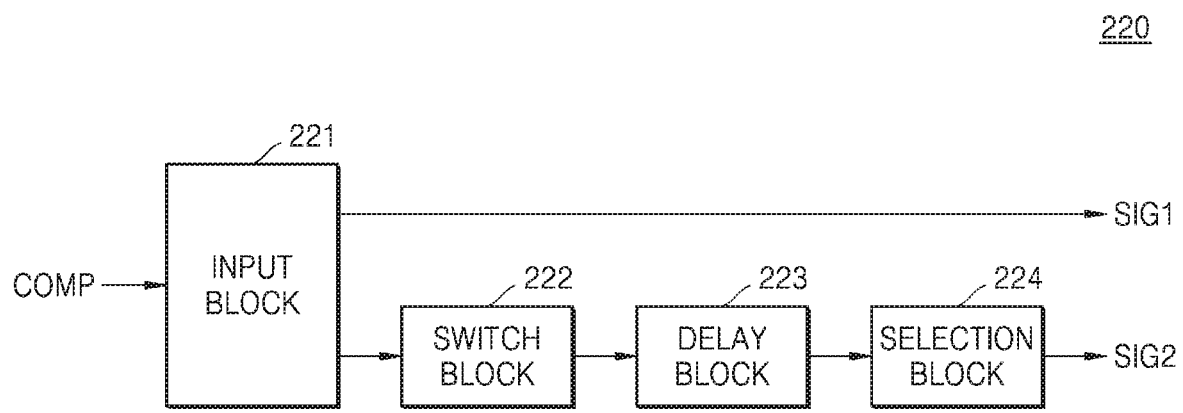
FIG. 3A is a block diagram of a delay circuit according to an exemplary embodiment of the inventive concept.

FIG. 3A is a block diagram of the delay circuit 220 according to an exemplary embodiment of the inventive concept. Referring to FIG. 3A, the delay circuit 220 includes an input block 221 (e.g., an input circuit), a switch block 222 (e.g., a switching circuit), a delay block 223 (e.g., logic for introducing a signal delay), and a selection block 224 (e.g., a selection circuit such as a multiplexer).

The input block 221 may output a signal, which has a phase that is identical or opposite to a phase of the comparison signal COMP output from the pixel array 110, to the latch circuit 240. The signal output to the latch circuit 240 may be referred to as the first signal SIG1. When the comparison signal COMP is not directly output to the latch circuit 240, the comparison signal COMP may go through another path. According to an exemplary embodiment, the comparison signal COMP applied to the input block 221 may be output to the switch block 222 as it is or after the phase thereof is inverted.

The switch block 222 may turn on or off the delay circuit 220. In other words, the switch block 222 may determine whether to operate the delay circuit 220 and thus determine whether to generate a signal delayed by the first time period.

The delay block 223 delays an input signal, which has the identical or opposite phase to the comparison signal COMP, by a certain time period. The delay block 223 may include a plurality of delay elements (e.g., logic circuits used for delaying a signal).

The selection block 224 may select a delay element that outputs the first delay signal among the delay elements. The first delay signal may be output as the second signal SIG2. In other words, the selection block 224 may generate the second signal SIG2 resulting from delaying the comparison signal COMP.

Figure 3B:
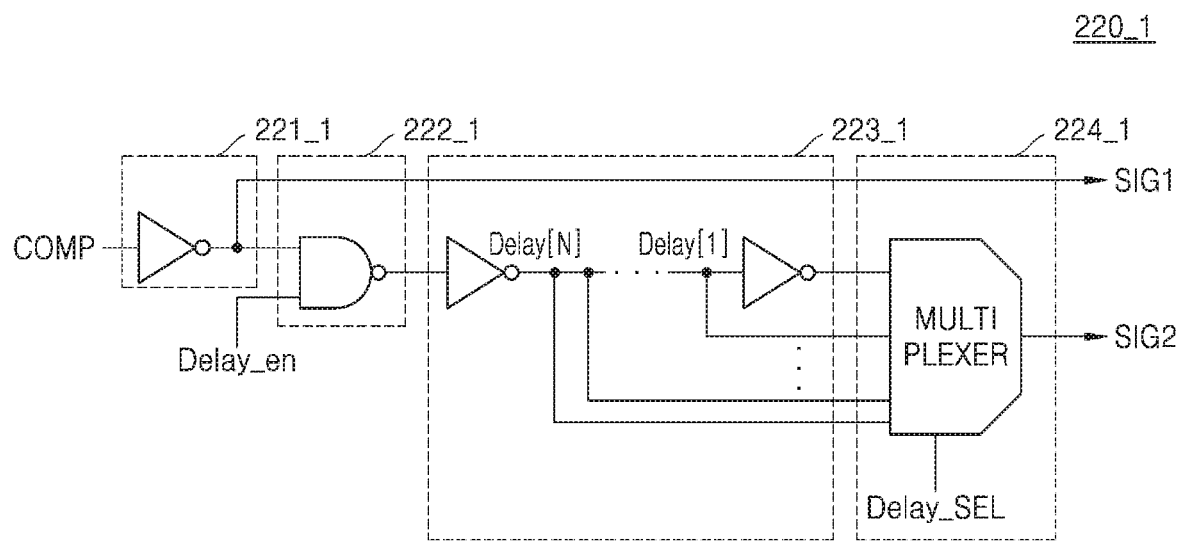
FIG. 3B is a circuit diagram of a delay circuit according to an exemplary embodiment of the inventive concept.

FIG. 3B is a circuit diagram of a delay circuit 220_1 according to an exemplary embodiment of the inventive concept. FIG. 3B illustrates the detailed circuit diagram of the delay circuit 220_1. The delay circuit 220_1 may be used to implement one of the delay elements.

An input block 221_1 may include an inverter or a buffer. The input block 221_1 receives the comparison signal COMP and outputs the comparison signal COMP to the latch circuit 240 as it is or after inverting the phase of the comparison signal COMP. The comparison signal COMP applied to the input block 221_1 may also be output to a switch block 222_1 as it is or after the phase thereof is inverted.

The switch block 222_1 includes a NAND gate. The switch block 222_1 determines whether to operate the delay circuit 220_1 in response to a delay enable signal Delay_en applied to the NAND gate. Accordingly, whether to generate a signal delayed by the first time period is determined. Although a NAND gate is illustrated in FIG. 3B, embodiments of the inventive concept are not limited thereto. Various logic elements or switches that determine whether to operate the delay circuit 220_1 may be used.

A delay block 223_1 may delay the comparison signal COMP or a signal, which results from inverting the phase of the comparison signal COMP, by a certain time period. The delay block 223_1 may include a plurality of delay elements, as described above.

Each of the delay elements may delay an input signal by a second time period. In other words, when the delay block 223_1 includes N delay elements, the delay block 223_1 may generate a total of N delay signals Delay_[1]:Delay_[N] including the delay signal Delay_[1] delayed by the second time period, the delay signal Delay_[2] delayed by a second time period, and a delay signal Delay_[N] delayed by the Nth time period. Although an inverter is illustrated as a delay element in FIG. 3B, embodiments of the inventive concept are not limited thereto, and various logic elements that delay signals may be used.

A selection block 224_1 selects one of the N delay signals Delay_[1]:Delay_[N] generated by the delay block 223_1. The selection block 224_1 may be implemented by a multiplexer. According to an exemplary embodiment, the selection block 224_1 selects a first delay signal delayed by the first time period among the N delay signals Delay_[1]:Delay_[N] in response to the delay select signal Delay_SEL output from the compensator 230. In other words, the selection block 224_1 may select a delay element that outputs the first delay signal among the delay elements. The first delay signal may be output as the second signal SIG2. In other words, the selection block 224_1 may generate the second signal SIG2 resulting from delaying the comparison signal COMP.

Referring to FIG. 3B, the selection block 224_1 may include a multiplexer MUX. According to an embodiment, the multiplexer MUX may select the first delay signal from a plurality of delay signals in response to the delay select signal Delay_SEL applied from the compensator 230 and output the first delay signal as the second signal SIG2. A delay element may be located between each of the node points illustrated in FIG. 3B so that each next input to the multiplexer is a signal that has been delayed by an increasing number of delay elements. Although a multiplexer MUX is illustrated in FIG. 3B, embodiments are not limited thereto, and various logic elements that generate a single output with respect to a plurality of inputs may be used.

Figure 4A:
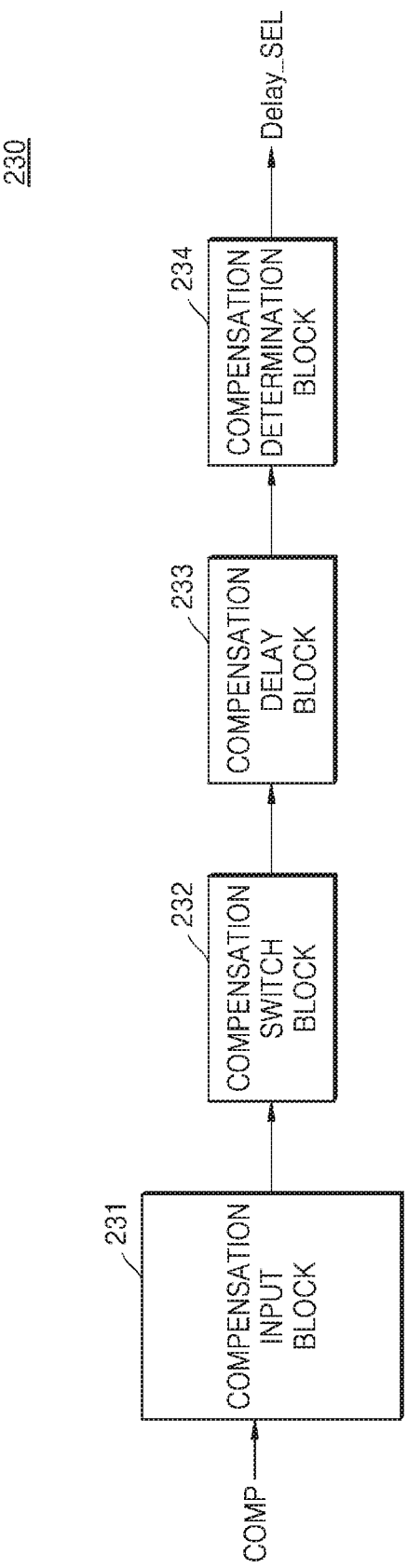
FIG. 4A is a block diagram of a compensator according to an exemplary embodiment of the inventive concept.

FIG. 4A is a block diagram of the compensator 230 according to an exemplary embodiment of the inventive concept. Referring to FIG. 4A, the compensator 230 includes a compensation input block 231 (e.g., a circuit), a compensation switch block 232 (e.g., a circuit), a compensation delay block 233 (e.g., a circuit), and a compensation determination block 234 (e.g., a circuit).

As described above, the compensator 230 may measure the period of an input signal; identify a compensation delay element, which outputs the delay select signal Delay_SEL for delaying a signal by a first time period (e.g., a time period corresponding to 0.5 LSB), among a plurality of compensation delay elements based on the measured period of the input signal; and generate a first delay select signal representing an index indicating the compensation delay element.

The compensation input block 231 may output a voltage from a power supply as it is or after the phase of the voltage is inverted. The voltage applied to the compensation input block 231 may be output to the compensation switch block 232 as it is or after the phase thereof is inverted.

The compensation switch block 232 may turn on or off the compensator 230. In other words, the compensation switch block 232 may determine whether to operate the compensator 230.

The compensation delay block 233 may delay, by a certain time period, an input voltage or a signal having an inverted phase of the input voltage. The compensation delay block 233 may include a plurality of compensation delay elements.

The compensation determination block 234 may measure the period of an input signal and generate, based on the measured period of the input signal, the delay select signal Delay_SEL indicating an index of a compensation delay element, which outputs the first delay select signal delayed by the first time period of the delay circuit 220, among the compensation delay elements. For example, the first time period may correspond to 0.5 LSB. In other words, the compensation determination block 234 may determine the amount of delay of a signal.

Figure 4B:
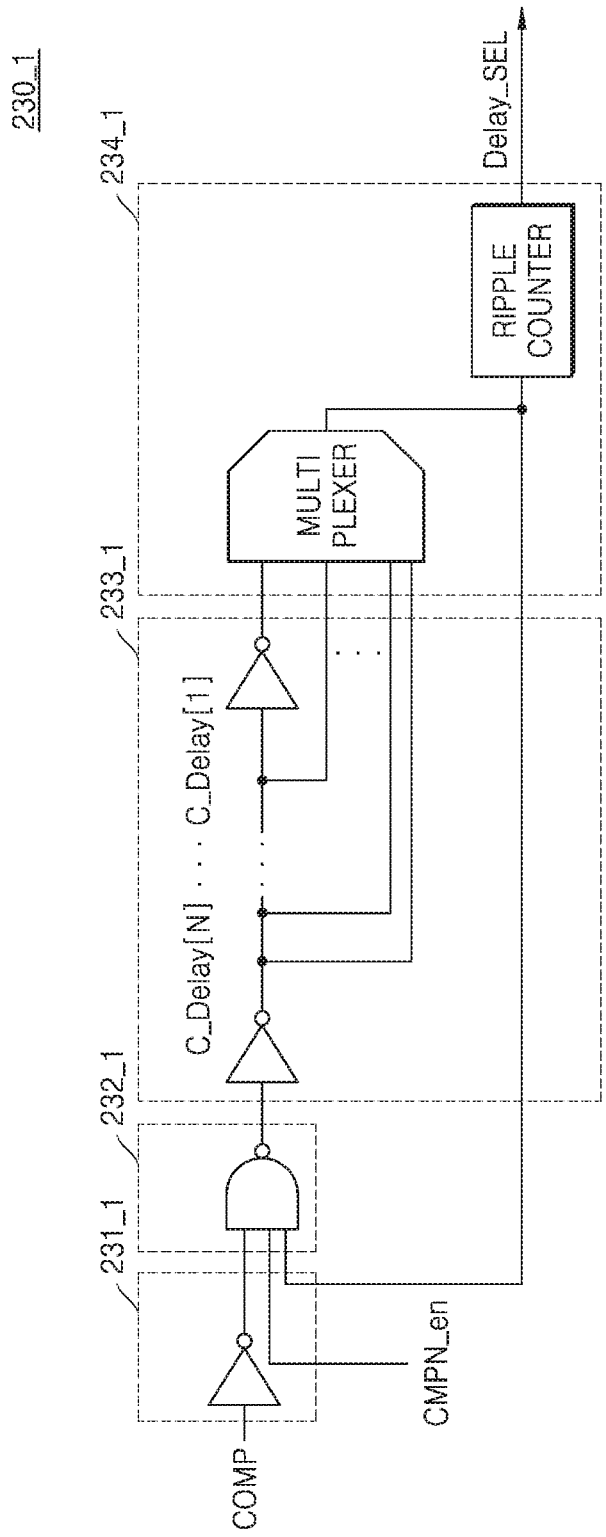
FIGS. 4B and 4C are circuit diagrams of compensators according to exemplary embodiments of the inventive concept.

FIG. 4B is a circuit diagram of a compensator 230_1 according to an exemplary embodiment of the inventive concept. The compensator 230_1 of FIG. 4B is an example of the compensator 230 of FIG. 4A. FIG. 4B illustrates an example in which the compensator 230 is configured as a ring oscillator type. Referring to FIG. 4B, the compensator 230_1 includes a compensation input block 231_1, a compensation switch block 232_1, a compensation delay block 233_1, and a compensation determination block 234_1.

A voltage applied to the compensation input block 231_1 may be output to the compensation switch block 232_1 as it is or after the phase thereof is inverted. The compensation input block 231_1 may include an inverter or a buffer. The compensation input block 231_1 receives the comparison signal COMP.

The compensation switch block 232_1 includes a NAND gate. The compensation switch block 232_1 may determine whether to operate the compensator 230_1 in response to the compensation enable signal CMPN_en applied to the NAND gate. Although a NAND gate is illustrated in FIG. 4B, embodiments of the inventive concept are not limited thereto, and various logic elements or switches that determine whether to operate the compensator 230_1 may be used. For example, besides the NAND gate, a two-stage NAND gate or a NOR gate having three inputs may be used.

The compensation delay block 233_1 may delay a voltage or a phase-inverted voltage by a certain time period. The compensation delay block 233_1 may include a plurality of compensation delay elements, as described above.

Each of the compensation delay elements may delay a signal by a second time period. In other words, when the compensation delay block 233_1 includes N compensation delay elements, the compensation delay block 233_1 may generate a total of N compensation delay signals C_Delay_[1]:C_Delay_[N] including the compensation delay signal C_Delay_[1] delayed by the second time period, the compensation delay signal C_Delay_[2] delayed by the second time period, and the compensation delay signal C_Delay_[N] delayed by the Nth time period. Although an inverter is illustrated as a compensation delay element in FIG. 4B, embodiments of the inventive concept are not limited thereto, and various logic elements that delay signals may be used.

The compensation determination block 234_1 selects one of the N compensation delay signals C_Delay_[1]:C_Delay_[N] generated by the compensation delay block 233_1. The compensation determination block 234_1 may measure the period of an input signal and generate, based on the measured period of the input signal, the delay select signal Delay_SEL indicating an index of a compensation delay element, which outputs the first delay select signal delayed by the first time period, among the compensation delay elements. The first time period may correspond to 0.5 LSB. In some cases, the first time period may correspond to 0.25 LSB. Besides 0.5 LSB and 025 LSB, the first time period may include various delay times required by ADCs.

The compensation determination block 234_1 includes a ripple counter Ripple CNT. The ripple counter Ripple CNT may count ripples in the measured period of the compensation signal COMP to generate a count result and generate the delay select signal Delay_SEL based on the count result. In other words, the ripple counter Ripple CNT may determine the period of an input signal.

The compensation determination block 234_1 includes a multiplexer MUX. In this case, the compensator 230_1 is considered a ring oscillator type TDC. Although ae multiplexer MUX is illustrated in FIG. 4B, embodiments of the inventive concept are not limited thereto, and various logic elements that generate a single output with respect to a plurality of inputs may be used.

Figure 4C:
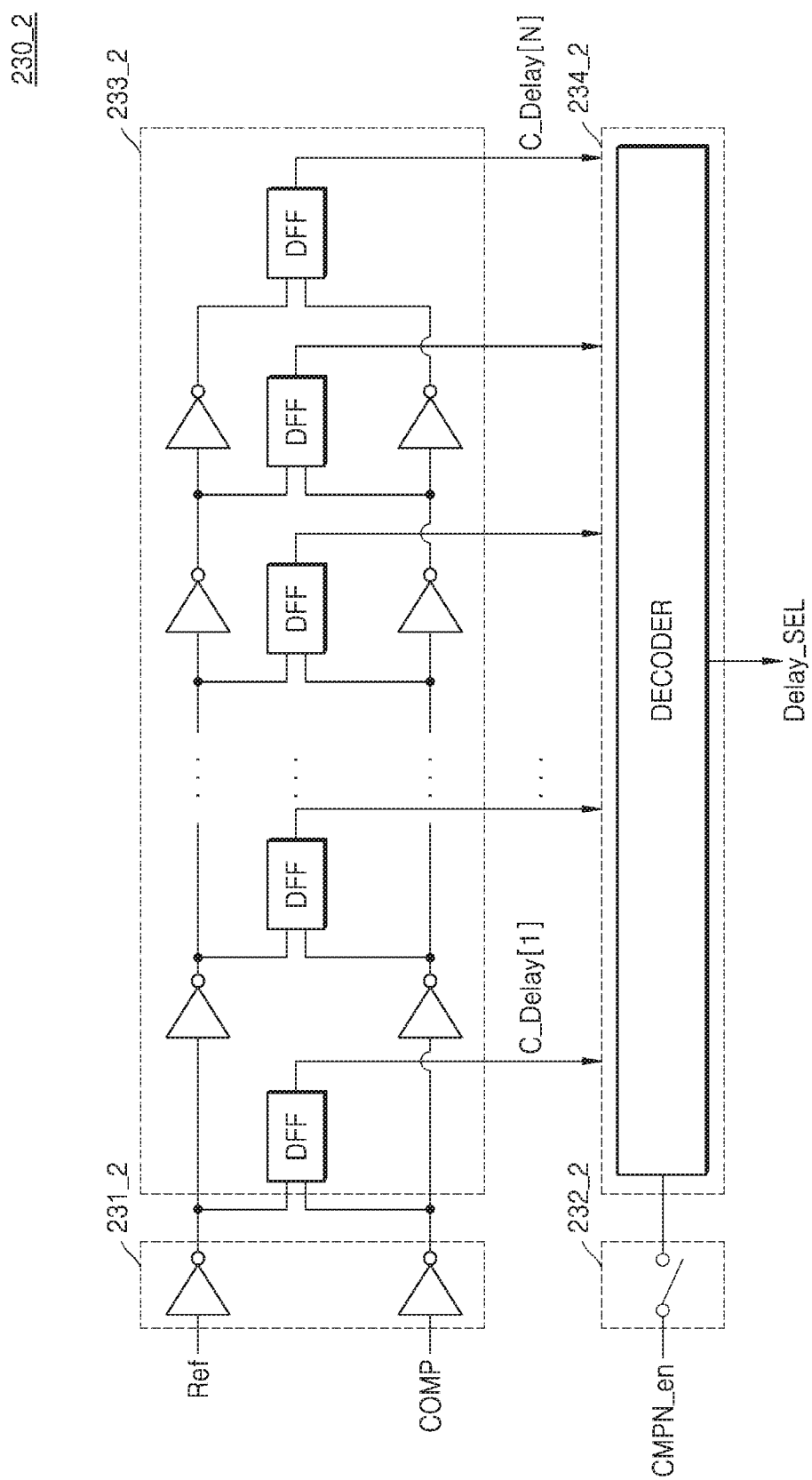

FIG. 4C is a circuit diagram of a compensator 230_2 according to an exemplary embodiment of the inventive concept. The compensator 230_2 of FIG. 4C is an example of the compensator 230 of FIG. 4A. Redundant descriptions given with FIG. 4B will be omitted. FIG. 4C illustrates an example in which the compensator 230 is configured as a Vernier type.

Referring to FIG. 4C, the compensator 230_2 includes a compensation input block 231_2, a compensation switch block 232_2, a compensation delay block 233_2, and a compensation determination block 234_2.

A voltage applied to the compensation input block 231_2 may be output to the compensation switch block 232_2 as it is or after the phase thereof is inverted. The compensation input block 231_2 may include an inverter or a buffer. The compensation input block 231_2 receives the comparison signal COMP. The compensation input block 231_2 also receives a reference signal Ref generated by the timing generator 150 in FIG. 1.

The compensation switch block 232_2 may determine whether to operate the compensator 230_2 using a switch. In an embodiment, the compensation switch block 232_2 determines whether to operate the compensator 230_2 in response to the compensation enable signal CMPN_en. Although the switch block 232_2 is illustrated as a switch in FIG. 4C, embodiments of the inventive concept are not limited thereto, and various logic elements that determine whether to operate the compensator 230_2 may be used. For example, a NAND gate, a two-stage NAND gate, or a NOR gate having three inputs may be used.

The compensation delay block 233_2 may delay a voltage or a phase-inverted voltage by a certain time period. The compensation delay block 233_2 may include a plurality of compensation delay elements, as described above.

Each of the compensation delay elements may delay a signal by a second time period. In other words, when the compensation delay block 233_2 includes N compensation delay elements, the compensation delay block 233_2 may generate a total of N compensation delay signals C_Delay_[1]:C_Delay_[N] including the compensation delay signal C_Delay_[1] delayed by a first time period, the compensation delay signal C_Delay_[2] delayed by a second time period, and the compensation delay signal C_Delay_[N] delayed by an N-th time period. Although a buffer and a D flip-flop (e.g., DFF) are illustrated as a compensation delay element in FIG. 4C, embodiments of the inventive concept are not limited thereto, and various logic elements that delay signals may be used.

The compensation determination block 234_2 may select one of the N compensation delay signals C_Delay_[1]:C_Delay_[N] generated by the compensation delay block 233_2. The compensation determination block 234_2 may measure the period of an input signal and generate, based on the measured period of the input signal, the delay select signal Delay_SEL indicating an index of a compensation delay element, which outputs the first delay select signal delayed by the first time period, among the compensation delay elements. For example, the first time period may correspond to 0.5 LSB. In some cases, the first time period may correspond to 0.25 LSB. Besides 0.5 LSB and 025 LSB, the first time period may include various delay times required by ADCs.

Referring to FIG. 4C, the compensation determination block 234_1 may include a decoder. In this case, the compensator 230_2 may be a Vernier type TDC. Compared to the ring oscillator type illustrated in FIG. 4B, the Vernier type TDC uses a D flip-flop instead of a plurality of connections of a NAND gate and an inverter. However, when an inverter is added to the front end of the D flip-flop, the influence of the D flip-flop is eliminated, and accordingly, the Vernier type compensator 230_2 of FIG. 4C may compensate for PVT noise, similarly to the ring oscillator type compensator 230_1.

Referring to FIG. 4C, the Vernier type compensator 230_2 outputs the delay select signal Delay_SEL by performing a logical operation on the comparison signal COMP and the reference signal Ref. Although a decoder is illustrated in FIG. 4C, embodiments of the inventive concept are not limited thereto, and various logic elements that generate a single output with respect to a plurality of inputs may be used.

Referring to FIGS. 3A through 4C, the ADC 200 including the delay circuit 220 and the compensator 230 may generate the second signal SIG2 by delaying the comparison signal COMP by the first time period (e.g., a time corresponding to 0.5 LSB). The compensator 230 has a similar path to the delay circuit 220 and is thus influenced by PVT noise similar to PVT noise distribution of the delay circuit 220. Accordingly, the compensator 230 may measure the period of a signal including PVT noise and generate the delay select signal Delay_SEL indicating an index of a compensation delay element outputting the first delay select signal delayed by the first time period. In other words, since the compensator 230 generates and outputs the delay select signal Delay_SEL to the delay circuit 220, taking into account the PVT noise, the delay circuit 220 may generate the second signal SIG2, which is more accurately delayed by the first time period, based on the delay select signal Delay_SEL.

The second signal SIG2 delayed by the first time period may processed by the latch circuit 240 and the counter 250 of the ADC 200 such that one-bit information may be additionally generated in addition to original bit information. The additionally-generated one bit may be an LSB and may refer to information of the lowest bit (e.g., the rightmost bit) in binary data. The additionally-generated bit will be described in detail with reference to FIGS. 5 and 6.

According to an exemplary embodiment, the ADC 200 additionally generates one bit without increasing the clock signal CLK, thereby increasing the operating speed thereof. The ADC 200 having the increased operating speed may have an increased digital resolution.

In addition, the ADC 200 may additionally generate one bit without increasing the clock signal CLK and thus increase the number of significant bits, thereby reducing power for maintaining an operating speed.

Figure 5:
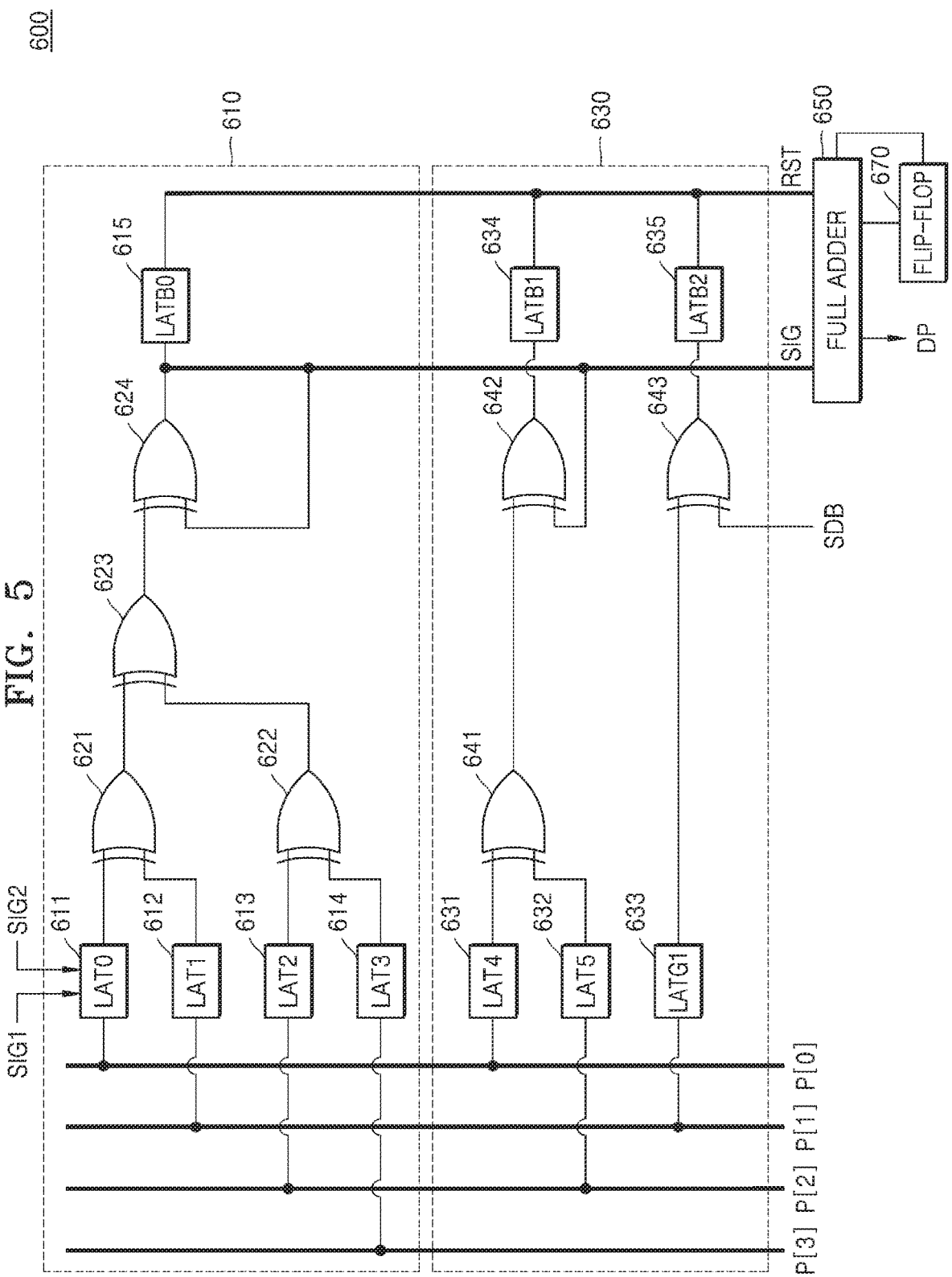
FIG. 5 is a circuit diagram of a latch circuit and counter, according to an exemplary embodiment of the inventive concept.

FIG. 5 is a circuit diagram of a latch circuit and counter 600, according to an exemplary embodiment of the inventive concept. For example, the latch circuit and counter 600 may be used to implement the latch circuit 240 and the counter 250.

Referring to FIG. 5, the ADC 200 includes a first block 610 generating an LSB and a second block 630 generating another bit (e.g., a most significant bit (MSB)) other than the LSB. The ADC 200 also includes a full adder 650 and a flip-flop 670.

The first block 610 and the second block 630 may include a plurality of latches and a plurality of logic elements (e.g., XOR gates). The first block 610 and the second block 630 may latch phase-shift signals P[0], P[1], P[2], and P[3] and perform logic conversion on latched signals, thereby sequentially generating binary signals.

In other words, the latch circuit and counter 600 may generate a binary code SIG, which is related to an image component, and a binary code RST, which is related to a reset component, based on the input phase-shift code IPSC.

The latch circuit and counter 600 may generate binary signals based on the four phase-shift signals P[0], P[1], P[2], and P[3], which have the same period and respectively have phases partially overlapping each other. The four phase-shift signals P[0], P[1], P[2], and P[3] may be generated by the phase generator 140. In other words, the input phase-shift code IPSC may be quadrature phase-shift code.

The second block 630 may generate a two-bit gray code based on the input phase-shift code IPSC including three phase-shift signals P[0], P[1], and P[2] among the four phase-shift signals P[0], P[1], P[2], and P[3].

The second block 630 includes XOR gates 641, 642, and 643 and latches 631, 632, 633, 634, and 635 (e.g., LAT4, LAT5, LATG1, LATB1, and LATB2). According to an embodiment, at least one latch and at least one XOR gate may be needed to generate a two-bit gray code.

A phase-shift bit corresponding to the phase-shift signal P[1] may be stored in the latch 633 and then output as the first bit of gray code. Phase-shift bits respectively corresponding to the phase-shift signals P[0] and P[2] may be respectively stored in the latches 631 and 632 and then go through an XOR operation in the XOR gate 641 so that the second bit of the gray code may be output from the XOR gate 641. The XOR gate 643 may perform an XOR operation on the first bit of the gray code and a sign decision bit SDB, thereby generating the first bit of binary code. The XOR gate 642 may perform an XOR operation on the first bit of the binary code, and the second bit of the gray code, which is output from the XOR gate 641, thereby generating the second bit of the binary code. The latch 635 may latch the first bit of the binary code, which is output from the XOR gate 643. The latch 634 may latch the second bit of the binary code, which is output from the XOR gate 642. The number of a plurality of latches, e.g., the latches 634 and 635, may be substantially the same as the number of bits in the binary code or in the gray code.

Since the first block 610 has a similar structure to the second block 630, description will be focused on the differences therebetween. The first block 610 may also use the phase-shift signal P[3] in addition to the phase-shift signals P[0], P[1], and P[2] used in the second block 630 among the phase-shift signals P[1] through P[3] of the input phase-shift code IPSC. In other words, the ADC 200 may additionally generate the phase-shift signal P[3] using the phase generator 140.

Phase-shift bits respectively corresponding to the phase-shift signals P[0] and P[1] may be respectively stored in latches 611 and 612 (e.g., LAT0 and LAT1) and then go through an XOR operation in an XOR gate 621 so that the third bit of the gray code may be output from the XOR gate 621. Phase-shift bits respectively corresponding to the phase-shift signals P[2] and P[3] may be respectively stored in latches 613 and 614 (e.g., LAT2 and LAT3) and then go through an XOR operation in an XOR gate 622 so that the fourth bit of the gray code may be output from the XOR gate 622. The XOR gate 623 may perform an XOR operation on the third and fourth bits of the gray code, thereby generating the fifth bit of the gray code. The XOR gate 624 may perform an XOR operation on the fifth bit of the gray code, which is output from the XOR gate 623, and the first bit of the binary code, thereby generating the third bit of the binary code as an LSB. The third bit of the binary code may be the LSB of a binary signal and may be a binary bit related to an image signal. The latch 615 (e.g., LATB0) may latch the third bit of the binary code, which is output from the XOR gate 624. The bit stored in the latch 615 may be the binary code RST related to a reset signal.

The full adder 650 may sequentially output binary signals based on the binary code RST for a reset component and the binary code SIG for an image component and the process of the flip-flop 670. The output signals may correspond to the digital pixel value DP.

The full adder 650 may perform bitwise processing and may include a first input terminal receiving the binary code SIG related to an image signal, a second input terminal receiving the binary code RST related to a reset signal, a third input terminal receiving an output of the flip-flop 670, a first output terminal outputting binary code bit by bit, and a second output terminal outputting a carry. According to an exemplary embodiment, the binary code RST related to a reset signal represents a negative value of the first bit of gray code, and the full adder 650 adds the binary code RST related to a reset signal and the binary code SIG related to an image signal bit by bit, thereby outputting a binary code. The binary code output by the full adder 650 may be referred to as the digital pixel value DP.

Although XOR gates 621 through 624 and 641 through 643 are illustrated as the counter 250 in FIG. 5, this is just an example, and various logic elements that generate the corresponding output may be used.

Referring to FIG. 2 through 5, the second signal SIG2 delayed by the first time period may additionally generate information about one bit. For example, a signal delayed by a time period corresponding to 0.5 LSB may be applied to the latch circuit and counter 600, thereby additionally generating information about the LSB of a binary code. According to an exemplary embodiment, the LSB may refer to a bit in the first decimal place. Although 0.5 LSB is described as an example, this is just for convenience of description. When a signal is delayed by a time period corresponding to 0.25 LSB, the additionally generated information may be about a bit in the second decimal place.

FIG. 6 is a timing diagram illustrating a clock signal CLK and signals generated from the clock signal CLK, according to an exemplary embodiment of the inventive concept. Clock speed or frequency of the clock signal may be assumed as A Ghz. Referring to FIG. 6, the phase-shift signals P<0>, P<1>, P<2>, and P<3> may be used to generate a gray code and a binary code which are related to two bits and additional bit information.

Referring to FIG. 6, when the clock signal CLK, which is constant (e.g., periodic), is provided, the phase-shift signals P<0> and P<1> have the same period and respectively have phases which partially overlap each other. Gray signals G<1>, G<2>, and G<3> in gray code may have different periods from one another. Unlike a general binary code, a gray code is configured such that two successive values differ in only one bit. The gray code may reduce data errors and thus may be used as input/output code. However, as an operating speed increases, the gray code may cause increases in a frequency and power consumption.

Referring to FIG. 6, the gray signal G<1> and the phase-shift signal P<1> have substantially the same waveform, and therefore, a phase-shift bit corresponding to the phase-shift signal P<1> may be used as it is to generate the first bit of the gray code. In addition, when an XOR operation is performed on the phase-shift signal P<2>, of which the phase leads that of the phase-shift signal P<1>, and the phase-shift signal P<0>, of which the phase lags the phase-shift signal P<1>, the gray signal G<1> is generated. Accordingly, an image sensor according to an exemplary embodiment may generate the second bit of the gray code by performing an XOR operation on a phase-shift code corresponding to the phase-shift signals P<0> and P<2>.

Referring to FIGS. 2 through 6, the gray code including the gray signals G<1>, G<2>, and G<3> is generated using the phase-shift signals P<0>, P<1>, and P<2> and a 4-bit binary signal (e.g., 0101.x) is generated. According to an exemplary embodiment, the ADC 200 additionally obtains one-bit information by additionally generating the phase-shift signal P<3>, which is not used conventionally, and thus generates a binary signal (e.g., 0101.1) having a fractional bit from the 4-bit binary signal (e.g., 0101.x). In other words, according to an exemplary embodiment of the inventive concept, an ADC generates phase-shift signals $P_{LSB}[0]$, $P_{LSB}[1]$, $P_{LSB}[2]$, and $P_{LSB}[3]$, which provide additional one-bit information, based on the phase-shift signals P<0> and P<1>, which have already been generated, and gray code (including the gray signals G<1> and G<2>), which is obtained by combining the phase-shift signals P<0> and P<1>, by additionally using the phase-shift signal P<3>.

By obtaining additional one-bit information, the digital resolution of the ADC 200 or the image sensor 10 may be increased without increasing the frequency of the clock signal CLK. In other words, power consumption for the same resolution may be reduced.

Figure 7A:
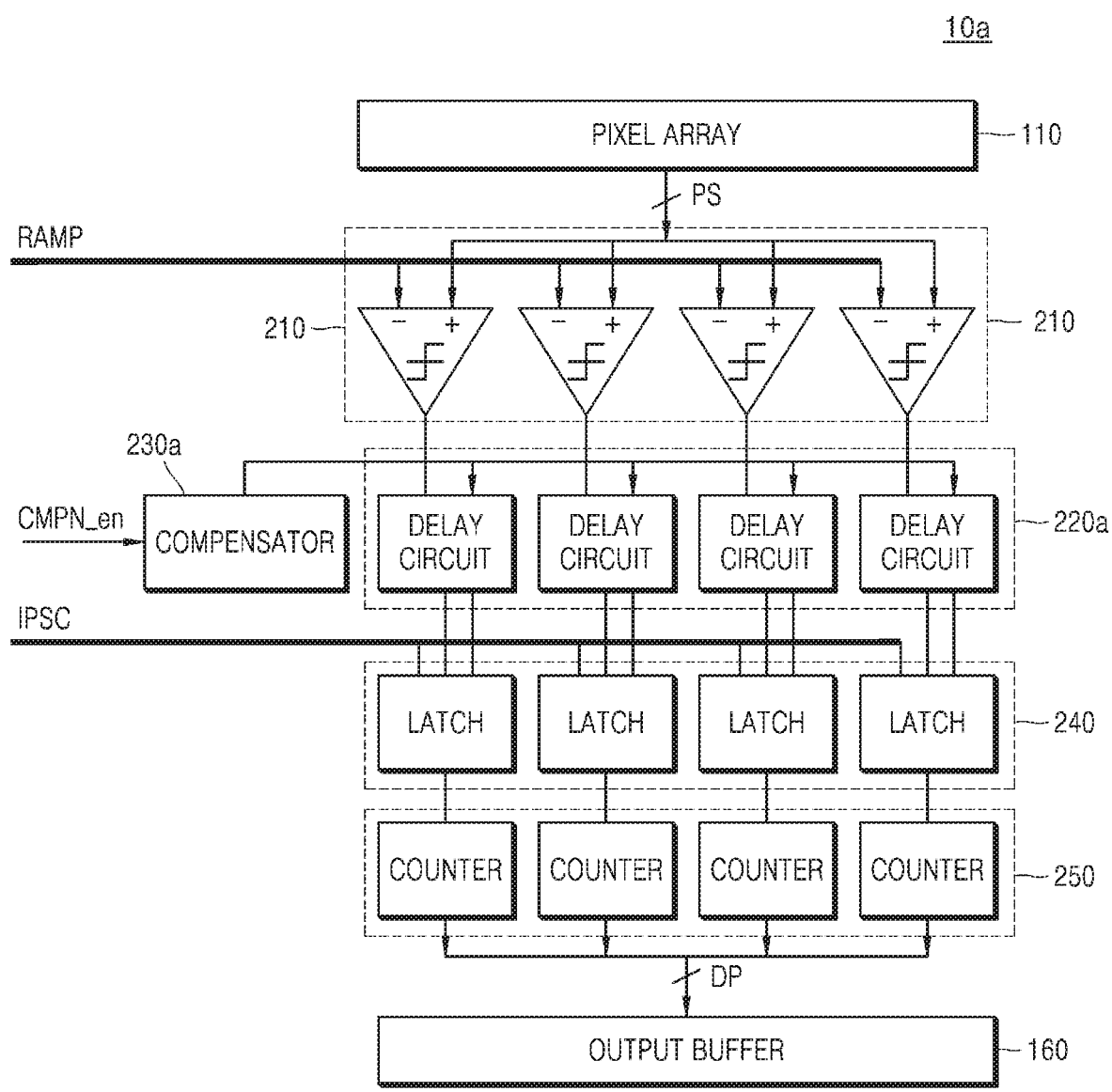
FIGS. 7A through 7C are block diagrams of image sensors including a delay circuit and a compensator, according to exemplary embodiments of the inventive concept.
Figure 7B:
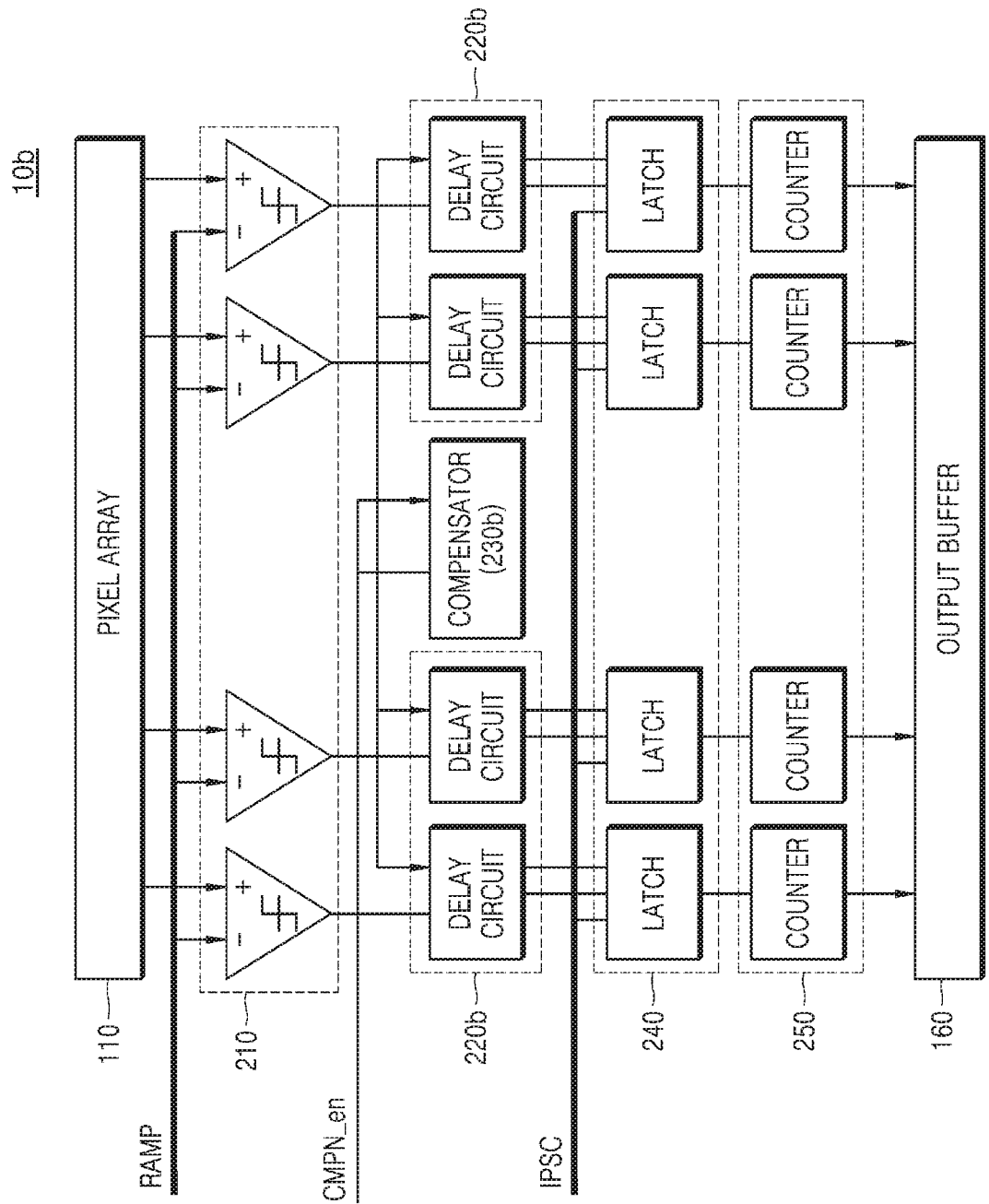
Figure 7C:
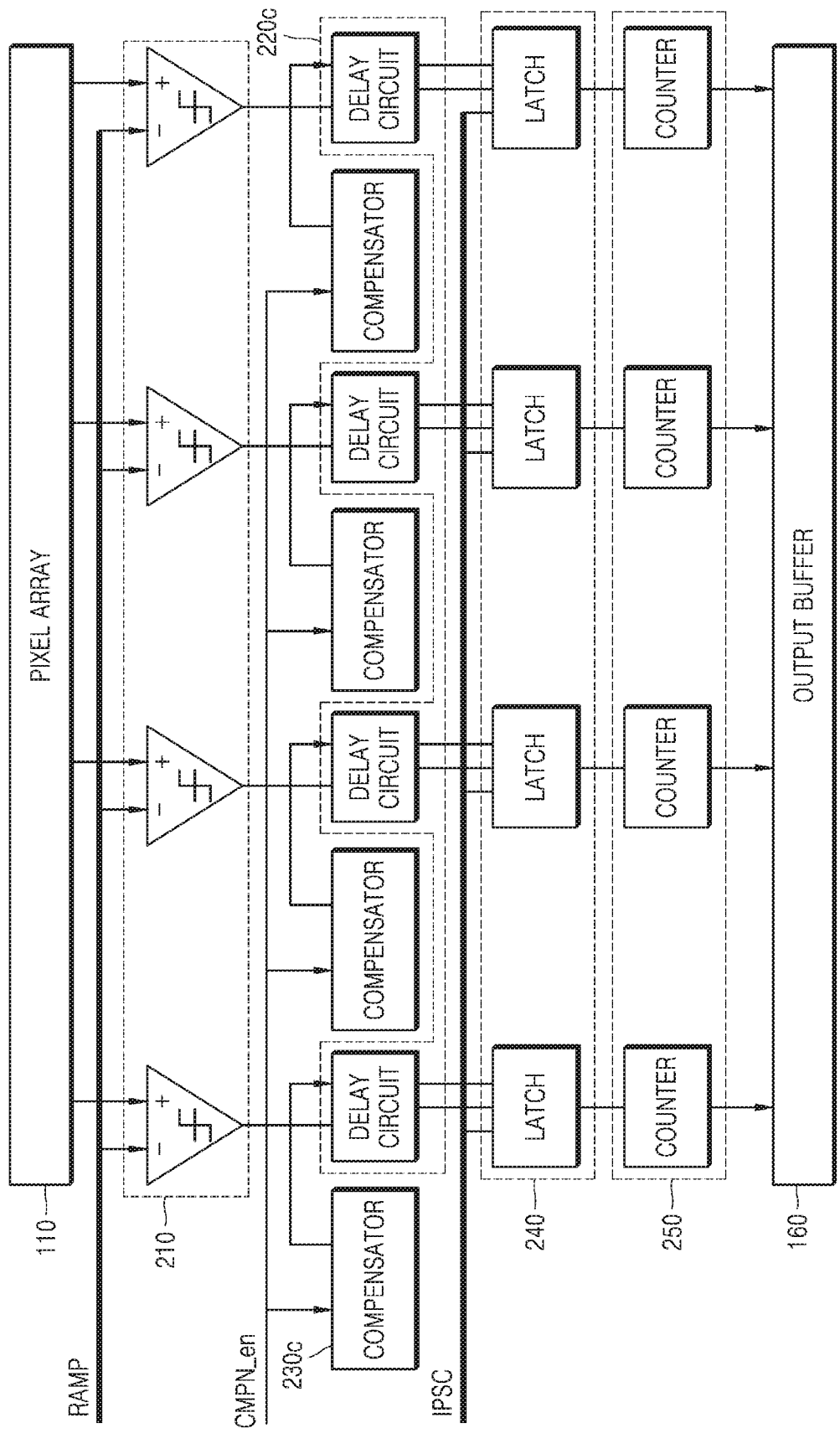

FIGS. 7A through 7C are block diagrams of image sensors including a delay circuit and a compensator, according to exemplary embodiments of the inventive concept. Referring to FIGS. 7A through 7C, the image sensor 10 includes the comparator 210, the delay circuit 220(a, b, c), the compensator 230(a, b, c), the latch circuit 240, the counter 250 and the output buffer 160. Redundant descriptions will be omitted.

Referring to FIG. 7A, four delay circuits 220a of an image sensor 10a are electrically connected to one compensator 230a. According to an exemplary embodiment, each of the delay circuits 220a outputs the second signal SIG2 in response to the delay select signal Delay_SEL from the compensator 230a. Although the compensator 230a is located before a line of the delay circuits 220a in FIG. 7A, the compensator 230a may be located after the series of the delay circuits 220a. Although four delay circuits 220a are illustrated in FIG. 7A, this is just for convenience of description, and additional delay circuits 220a may be included in an image sensor. For example, an image sensor may include N delay circuits 220a corresponding to the number of columns of a pixel array, where N is the number of columns in an M×N pixel array. For example, the comparator 210 may receive a plurality of pixel signals PS (e.g., one for every column of the pixel array 110) and output a plurality of comparison signals based on a comparison of the pixel signals and the ramp signal RAMP.

Referring to FIG. 7B, four delay circuit 220b of an image sensor 10b are electrically connected to one compensator 230b, and the compensator 230b is located in the middle among the four delay circuits 220b. For example, the compensator 230b may be located between pairs of the delay circuits 220b. Since the compensator 230b is located in the middle among a line of the delay circuits 220b, a variation in PVT noise distribution with respect to distances between the compensator 230b and the delay circuits 220b may be relatively small.

Figure 8:
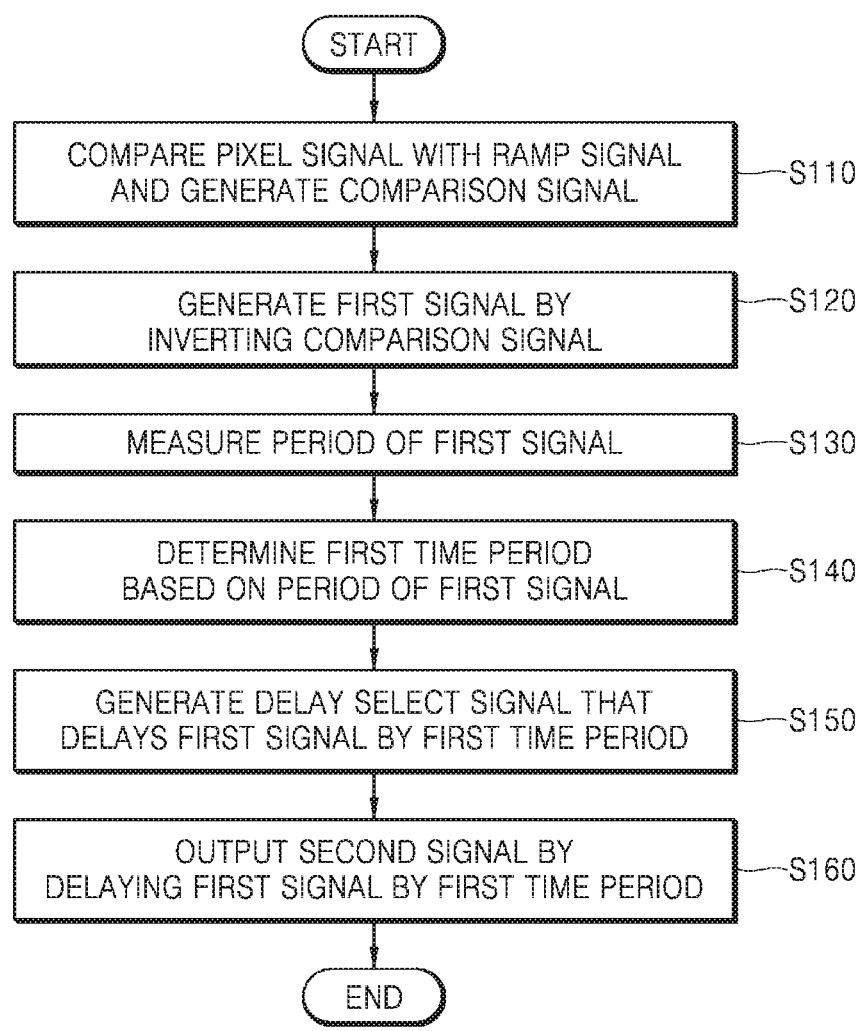
FIGS. 8 and 9 are flowchart of a method of operating an ADC, according to an exemplary embodiment of the inventive concept.

Referring to FIG. 7C, four delay circuit 220c of an image sensor 10c are electrically connected to four compensators 230c, respectively. In other words, the compensators 230c and the delay circuits 220c may be arranged in one-to-one correspondence. Each compensator 230c outputs the delay select signal Delay_SEL to a delay circuit 220c corresponding thereto, taking into account PVT noise. The second signal SIG2 delayed by a first time period by the delay circuit 220c may be more accurate when there is a greater number of compensators 230c. According to an exemplary embodiment, to generate the second signal SIG2 most accurately delayed by the first time period, as many compensators 230c as the number of delay circuits 220c are included in the image sensor 10. However, the four delay circuits 220c and the four compensators 230c are illustrated just for convenience of description. A plurality of compensators 230c and a plurality of delay circuits 220c may be included in the image sensor 10c in a one-to-one correspondence. Although it is illustrated in FIG. 7C that one compensator is connected to one delay circuit, embodiments of the inventive concept are not limited thereto and an image sensor may include a plurality of compensators connected to a plurality of delay circuits. FIG. 8 is a flowchart of a method of operating an ADC, according to an exemplary embodiment of the inventive concept.

Referring to FIGS. 1, 2, and 8, the comparator 210 of the ADC 200 compares the pixel signal PS output from the pixel array 110 with the ramp signal RAMP output from the ramp generator 130 and generates the comparison signal COMP in operation S110.

The delay circuit 220 of the ADC 200 generates the first signal SIG1 by inverting the comparison signal COMP in operation S120. In an alternate embodiment, the first signal SIG1 may be obtained by outputting the comparison signal COMP as it is (e.g., without inversion).

The compensator 230 of the ADC 200 measures a period of the first signal SIG1 based on the comparison signal COMP in operation S130. The measuring of the period of the first signal SIG1 may be performed by a ripple counter Ripple CNT (see FIG. 4B).

The compensator 230 determines a first time period based on the period of the first signal SIG1 in operation S140. The first time period may correspond to 0.5 LSB. In some cases, the first time period may correspond to 0.25 LSB.

The compensator 230 generates a delay select signal Delay_SEL, which delays the first signal SIG1 by the first time period, in operation S150.

The delay circuit 220 outputs a second signal SIG2 to the latch circuit 240 by delaying the first signal SIG1 by the first time period in operation S160.

Figure 9:
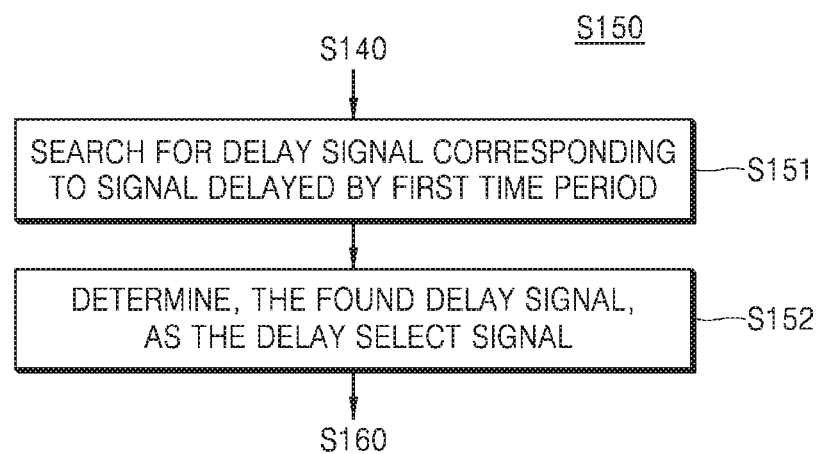

FIG. 9 is a flowchart of a method of operating an ADC, according to an exemplary embodiment of the inventive concept. In an exemplary embodiment, FIG. 9 is a detailed flowchart of operation S150 in FIG. 8.

Referring to FIG. 9, the compensator 230 searches for a compensation delay element, which outputs a compensation delay signal corresponding to a delay signal delayed by the first time period, in operation S151. For example, the compensator 230 may search for a delay signal corresponding to the signal delayed by the first time period.

The compensator 230 outputs, as the delay select signal Delay_SEL, a signal indicating a found compensation delay element in operation S152. The delay circuit 220 may output the second signal SIG2 to the latch circuit 240 by delaying the first signal SIG1 by the first time period in operation S160. For example, the compensator 230 may determine the found delay signal, as the delay select signal Delay_SEL.

Figure 10:
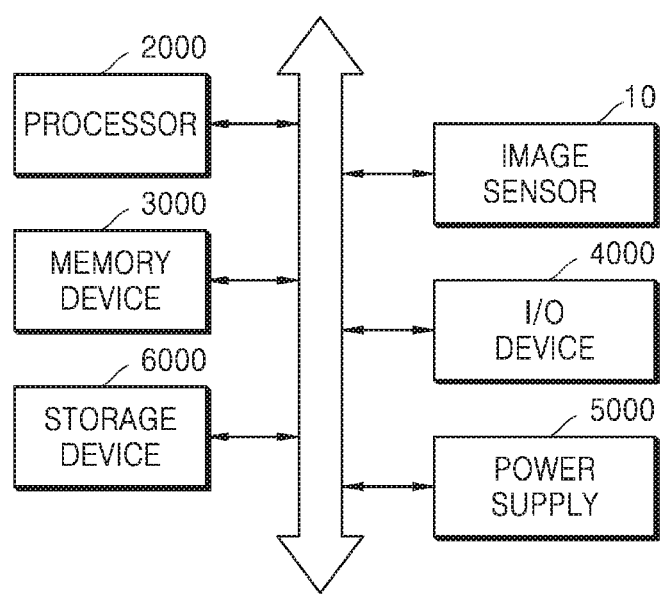
FIG. 10 is a block diagram of an electronic device including an image sensor, according to an exemplary embodiment of the inventive concept.

FIG. 10 is a block diagram of an electronic device including the image sensor 10, according to an exemplary embodiment of the inventive concept. FIG. 10 may be a hierarchically expanded diagram of an electronic device including the image sensor 10 including the ADC 200 including the delay circuit 220 and the compensator 230. Referring to FIG. 10, the electronic device includes the image sensor 10, a processor 2000, a memory device 3000, an input/output (I/O) device 4000, a power supply 5000, and a storage device 6000.

Referring to FIGS. 1 and 10, the processor 2000 may perform particular computations or tasks needed for the operation of the image processing system 1, and the memory device 3000 and the storage device 6000 may store data needed for the operation of the image processing system 1. For example, the processor 2000 may include a microprocessor, a central processing unit (CPU), or an application processor (AP). The memory device 3000 may include volatile memory and/or non-volatile memory. The storage device 6000 may include a solid state drive (SSD), a hard disk drive (HDD) or a CD-ROM. The I/O device 4000 may include an input unit such as a keyboard, a keypad, or a mouse and an output unit such as a printer or a display. The power supply 5000 may supply an operating voltage needed for the operation of the image processing system 1.

While the inventive concept has been particularly shown and described with reference to embodiments thereof, it will be understood that various changes in form and details may be made therein without departing from the spirit and scope of the inventive concept.

What is claimed is:

1. An analog-to-digital converter for converting a pixel signal generated from sensed light into a digital signal, the analog-to-digital converter comprising:
   a comparator configured to compare the pixel signal with a ramp signal having a constant slope to generate a comparison signal;
   a delay circuit configured to generate a first signal corresponding to the comparison signal, the delay circuit including a plurality of delay elements configured to generate a second signal by delaying the first signal by a first time period; and
   a compensator circuit configured to measure a period of the comparison signal to output a delay select signal to the delay circuit based on the measured period, the delay select signal delaying the first signal by the first time period,
   wherein the first time period is obtained by dividing the period of the comparison signal.

2. The analog-to-digital converter of claim 1, wherein the plurality of delay elements are configured to delay the comparison signal by a second time period,
   wherein the delay circuit further includes a multiplexer receiving a plurality of delay signals respectively output from the plurality of delay elements, and
   the multiplexer is configured to select a first delay select signal from the plurality of delay signals based on the delay select signal.

3. The analog-to-digital converter of claim 1, wherein the compensator circuit includes a plurality of compensation delay elements configured to delay the comparison signal and
   is configured to select a compensation delay element among the compensation delay elements based on the period of the comparison signal, the selected compensation delay element outputting a signal corresponding to the first time period, and configured to output a first delay select signal to the delay circuit, the first delay select signal indicating an index of the selected compensation delay element.

4. The analog-to-digital converter of claim 3, wherein the first time period is ½ of the period of the comparison signal.

5. The analog-to-digital converter of claim 3, wherein the first time period is ¼ of the period of the comparison signal.

6. The analog-to-digital converter of claim 3, wherein a plurality of comparison signals including the comparison signal are output from columns of a pixel array of an image sensor, and
   the compensator circuit includes a plurality of compensators configured to measure a period of a corresponding one of the comparison signals.

7. The analog-to-digital converter of claim 3, wherein the compensator circuit further includes a multiplexer configured to receive a plurality of compensation delay signals respectively output from the plurality of compensation delay elements and a ripple counter configured to count ripples in the period of the comparison signal to output a count result and to generate the delay select signal based on the count result.

8. The analog-to-digital converter of claim 3, wherein the plurality of compensation delay elements include at least one D flip-flop.

9. An image sensor comprising:
   a pixel array including a plurality of pixels arranged in a matrix, each of the plurality of pixels configured to generate a pixel signal;

a ramp generator configured to generate a ramp signal in response to a ramp enable signal, the ramp signal having a constant slope;

a comparator configured to compare the pixel signal with the ramp signal to generate a comparison signal;

a plurality of delay circuits each including a plurality of delay elements configured to delay the comparison signal, each of the plurality of delay circuits configured to generate a first signal corresponding to the comparison signal and to generate a second signal by delaying the first signal by a first time period;

a compensator circuit configured to measure a period of the comparison signal and to output a delay select signal to the plurality of delay circuits based on the measured period, the delay select signal delaying the first signal by the first time period;

a phase generator configured to generate a plurality of phase-shift codes based on a clock signal;

a timing generator configured to generate the clock signal and the ramp enable signal;

a latch circuit configured to latch the plurality of phase-shift codes based on the first signal and the second signal; and a column counter configured to generate a binary code based on a digital code output from the latch circuit and to sequentially output the binary code bit by bit, wherein the first time period is obtained by dividing the period of the comparison signal.

10. The image sensor of claim 9, wherein the plurality of delay elements are configured to delay the comparison signal by a second time period, wherein each of the plurality of delay circuits further includes a multiplexer receiving a plurality of delay signals respectively output from the plurality of delay elements, and wherein the multiplexer is configured to select a first delay select signal from the plurality of delay signals based on the delay select signal.

11. The image sensor of claim 9, wherein the compensator circuit includes a plurality of compensation delay elements configured to delay the comparison signal and is configured to select a compensation delay element among the compensation delay elements based on the period of the comparison signal, the selected compensation delay element outputting a signal corresponding to the first time period, and configured to output a first delay select signal to the plurality of delay circuits, the first delay select signal indicating an index of the selected compensation delay element.

12. The image sensor of claim 11, wherein the first time period is ½ of the period of the comparison signal.

13. The image sensor of claim 11, wherein the plurality of phase-shift codes include a first phase-shift code, a second phase-shift code, and a third phase-shift code; and the phase generator further generates a fourth phase-shift code.

14. The image sensor of claim 13, wherein the latch circuit latches the first through fourth phase-shift codes based on the first signal and the second signal.

15. The image sensor of claim 14, wherein the column counter is further configured to obtain additional bit information based on the digital code.

16. The image sensor of claim 15, wherein the column counter is configured to generate a gray code by converting the digital code and to generate the binary code by converting the gray code.

17. The image sensor of claim 9, wherein the timing generator is configured to further generate a compensator enable signal, and the compensator circuit is turned on or off in response to the compensator enable signal.

18. A method of operating an analog-to-digital converter, the method comprising:

comparing a pixel signal with a ramp signal to generate a comparison signal;

inverting the comparison signal to generate a first signal;

measuring a period of the first signal;

determining a first time period based on the measured period;

generating a delay select signal for delaying the first signal by the first time period; and outputting a second signal by delaying the first signal by the first time period based on the delay select signal.

19. The method of claim 18, wherein the first time period is ½ of the period of the first signal.

20. The method of claim 19, wherein the determining of the first time period comprises counting a period corresponding to ½ of the period of the first signal, and the generating of the delay select signal comprises:

searching a plurality of delay signals to find a delay signal delayed by the first time period; and determining, the found delay signal, as the delay select signal.

* * * * *